(12) United States Patent
Jiang et al.

(10) Patent No.: US 11,171,303 B2
(45) Date of Patent: Nov. 9, 2021

(54) DISPLAY PANEL AND METHOD FOR FABRICATING THE SAME

(71) Applicants: Chengdu BOE Optoelectronics Technology Co., Ltd., Chengdu (CN); BOE Technology Group Co., Ltd., Beijing (CN)

(72) Inventors: Zhiliang Jiang, Beijing (CN); Pan Zhao, Beijing (CN); Chao Kong, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 85 days.

(21) Appl. No.: 16/397,287

(22) Filed: Apr. 29, 2019

(65) Prior Publication Data

US 2020/0044183 A1 Feb. 6, 2020

(30) Foreign Application Priority Data

Aug. 6, 2018 (CN) .......................... 201810886791.0

(51) Int. Cl.
*H01L 51/52* (2006.01)
*H01L 27/32* (2006.01)

(52) U.S. Cl.
CPC ...... *H01L 51/5221* (2013.01); *H01L 27/3246* (2013.01); *H01L 51/5253* (2013.01);
(Continued)

(58) Field of Classification Search
CPC ............ H01L 51/5221; H01L 51/5228; H01L 51/5234; H01L 51/5293;
(Continued)

(56) References Cited

U.S. PATENT DOCUMENTS

| | | | | |
|---|---|---|---|---|
| 2001/0017518 A1* | 8/2001 | Mizutani | ............. | H01L 51/0023 313/504 |
| 2011/0079783 A1* | 4/2011 | Choi | ................... | H01L 51/5265 257/59 |
| 2017/0155077 A1 | 7/2017 | Li et al. | | |

FOREIGN PATENT DOCUMENTS

| | | | |
|---|---|---|---|
| CN | 103681775 A | * | 3/2014 |
| CN | 103681775 A | | 3/2014 |

(Continued)

OTHER PUBLICATIONS

Translation of CN103681775, translation on Dec. 9, 2020.*
(Continued)

*Primary Examiner* — Amar Movva
(74) *Attorney, Agent, or Firm* — Arent Fox LLP; Michael Fainberg

(57) ABSTRACT

The disclosure relates to the field of display technologies, and discloses a display panel and a method for fabricating the same, and the display panel includes: a base substrate, a pixel definition layer and a cathode layer arranged on one side of the base substrate successively, and a transparent electrically-conductive film arranged on the side of the cathode layer away from the base substrate, wherein the transparent electrically-conductive film is electrically connected with the cathode layer so that the transparent electrically-conductive film is in parallel to the cathode layer.

8 Claims, 1 Drawing Sheet

(52) U.S. Cl.
CPC ...... *H01L 51/5293* (2013.01); *H01L 51/5228* (2013.01); *H01L 51/5234* (2013.01); *H01L 2227/323* (2013.01)

(58) Field of Classification Search
CPC ... H01L 51/5281–5284; H01L 27/3246; H01L 27/3283; H01L 27/3295
See application file for complete search history.

(56) References Cited

FOREIGN PATENT DOCUMENTS

| | | | |
|---|---|---|---|
| CN | 104953044 A | | 9/2015 |
| CN | 105428548 A | | 3/2016 |
| CN | 107168465 A | * | 9/2017 |
| CN | 107168465 A | | 9/2017 |
| CN | 107845665 A | | 3/2018 |
| CN | 207068930 U | | 3/2018 |

OTHER PUBLICATIONS

Office Action dated Aug. 10, 2020 for Chinese Application No. 201810886791.0.
Office Action dated Mar. 30, 2020 for Chinese Application No. 201810886791.0.
Office Action dated Dec. 22, 2020 for Chinese Application No. 201810886791.0.

\* cited by examiner

DISPLAY PANEL AND METHOD FOR FABRICATING THE SAME

CROSS-REFERENCE TO RELATED APPLICATION

This application claims priority of Chinese Patent Application No. 201810886791.0, filed on Aug. 6, 2018, which is hereby incorporated by reference in its entirety.

FIELD

The present disclosure relates to the field of display technologies, and particularly to a display panel and a method for fabricating the same.

BACKGROUND

As there is a growing demand for an Active-Matrix Organic Light-Emitting Diode (AMOLED) display panel, a strict requirement for its parameters is more and more, and particularly the brightness parameters is such one of important indexes that affects a good user experience, so there remains a common demand for higher brightness uniformity thereof.

SUMMARY

The disclosure provides following technical solutions.

Some embodiments of the disclosure provide a display panel including: an base substrate, a pixel definition layer and a cathode layer arranged on one side of the base substrate successively, and a transparent electrically-conductive film arranged on the side of the cathode layer away from the base substrate, wherein the transparent electrically-conductive film is electrically connected with the cathode layer so that the transparent electrically-conductive film is in parallel with the cathode layer.

Optionally, a polarizing sheet is arranged between the transparent electrically-conductive film and the cathode layer, a plurality of through-holes are formed on the polarizing sheet, the transparent electrically-conductive film is electrically connected with the cathode layer through the through-holes, and projections of the through-holes onto the base substrate does not overlap with a projection of pixels of the pixel definition layer onto the base substrate.

Optionally, a protecting layer is arranged on a side of the transparent electrically-conductive film away from the base substrate.

Optionally, a polarizing sheet and a protecting layer are arranged on the side of the transparent electrically-conductive film away from the base substrate successively.

Optionally, the transparent electrically-conductive film is an ITO film.

Optionally, the cathode layer is made of a magnesium-silver alloy.

Some embodiments of the disclosure further provides a method for fabricating the display panel above, the method including:

forming a pixel definition layer on a base substrate, and patterning the pixel definition layer in an etching process;

forming a cathode layer and a transparent electrically-conductive film on the pixel definition layer;

the transparent electrically-conductive film electrically connected with the cathode layer.

Optionally, before the transparent electrically-conductive film is formed on the cathode layer, the method further includes:

forming a polarizing sheet on the cathode layer, and forming a plurality of through-holes on the polarizing sheet in a patterning process, wherein a projection of each through-hole onto the base substrate does not overlap with a projection of a pixel on the pixel definition layer onto the base substrate.

Optionally, the method further includes:

forming a protecting layer on the transparent electrically-conductive film.

Optionally, the method further includes:

forming a polarizing sheet on the transparent electrically-conductive film; and forming a protecting layer on the polarizing sheet.

DETAILED DESCRIPTION OF THE EMBODIMENTS

The technical solutions according to embodiments of the disclosure will be described below clearly and fully with reference to the drawings in the embodiments of the disclosure, and apparently the embodiments to be described are only a part but all of embodiments of the disclosure. Based upon the embodiments here of the disclosure, all of other embodiments which can occur to those ordinarily skilled in the art without any inventive effort shall come into the scope of the disclosure as claimed.

Figure 1:
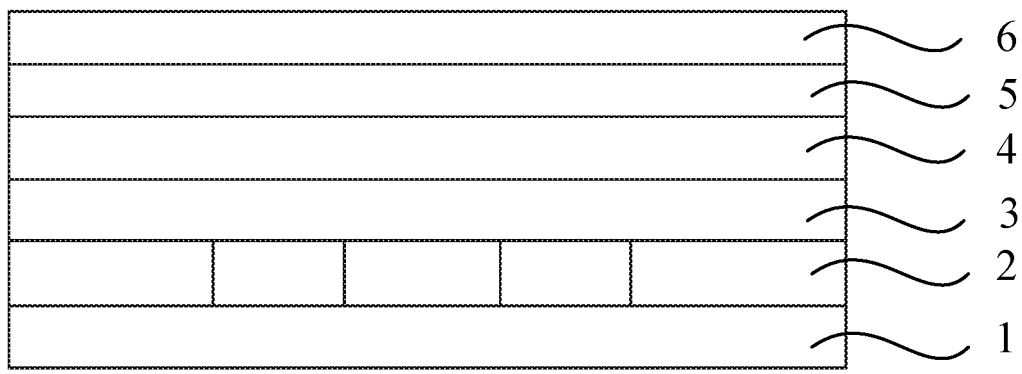
FIG. 1 is a schematic structural diagram of a display panel according to some embodiments of the disclosure.

Referring to FIG. 1, a display panel according to some embodiments of the disclosure includes: a base substrate 1, a pixel definition layer 2 and a cathode layer 3 arranged on one side of the base substrate 1 successively, and a transparent electrically-conductive film 4 arranged on the side of the cathode layer 3 away from the base substrate 1, where the transparent electrically-conductive film is electrically connected with the cathode layer so that the transparent electrically-conductive film is in parallel with the cathode layer.

In the display panel above, the pixel definition layer 2 and the cathode layer 3 are arranged on the base substrate 1 successively, and the transparent electrically-conductive film electrically connected with the cathode layer 3 is arranged on the side of the cathode layer 3 away from the base substrate 1, so that the transparent electrically-conductive film is in parallel with the cathode layer, that is, the transparent electrically-conductive film is electrically connected with the cathode layer 3 to thereby expand a channel of current so as to lower a cathode resistance, thus reducing a voltage drop on the side of the display panel away from an integrated circuit, and improving the uniformity of brightness of the display panel.

Moreover, the transparent electrically-conductive film 4 has a high transmittivity to thereby guarantee a light exit ratio of the pixel definition layer 2.

The transparent electrically-conductive film 4 electrically connected with the cathode layer 3 can be positioned in the following two implementations.

In a first implementation:

as illustrated in FIG. 1, the pixel definition layer 2, the cathode layer 3, the transparent electrically-conductive film 4, a polarizing sheet 5, and a protecting layer 6 are arranged on the base substrate 1 successively, where the transparent electrically-conductive film 4 is formed directly on the cathode layer 3, and electrically connected with the cathode layer 3 to thereby lower the resistance of the cathode layer 3.

Figure 2:
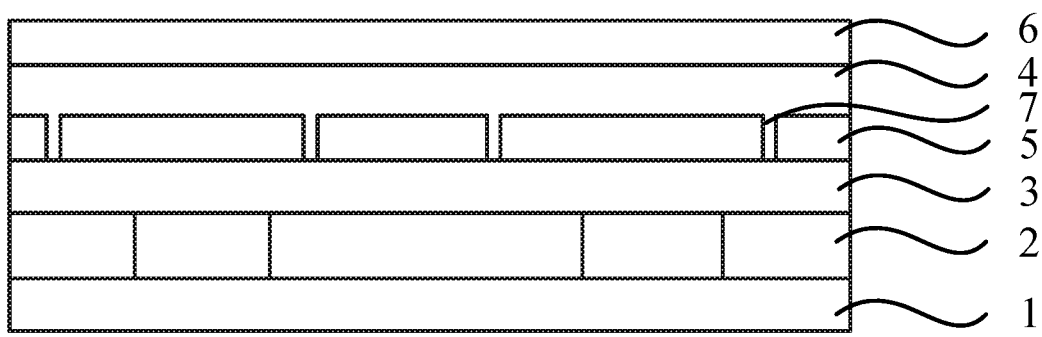
FIG. 2 is a schematic structural diagram of a display panel according to other embodiments of the disclosure.

In a second implementation:

as illustrated in FIG. 2, the pixel definition layer 2, the cathode layer 3, a polarizing sheet 5, the transparent electrically-conductive film 4, and a protecting layer 6 are arranged on the base substrate 1 successively, where a plurality of through-holes are formed on the polarizing sheet 5, the transparent electrically-conductive film 4 is electrically connected with the cathode layer 3 through the through-holes 7, and projections of the through-holes 7 onto the base substrate 1 do not overlap with projections of pixels in the pixel definition layer onto the base substrate 1.

In the second implementation, the plurality of through-holes are formed on the polarizing sheet 5, and the transparent electrically-conductive film 4 is electrically connected with the cathode layer 3 through the through-holes 7 to thereby lower the resistance of the cathode layer 3, thus reducing a voltage drop on the side of the display panel away from an integrated circuit, and improving the uniformity of brightness of the display panel.

Moreover, in some embodiments, the projections of the through-holes 7 onto the base substrate 1 do not overlap with projections of the pixels in the pixel definition layer onto the base substrate 1 to thereby enable light to exit the pixels normally.

In both the first implementation and the second implementation, the protecting layer is arranged to protect the transparent electrically-conductive film or the polarizing sheet 5 from being scratched so as to prolong the lifetime of the display panel.

Optionally, the transparent electrically-conductive film 4 is an ITO film.

The transparent electrically-conductive film 4 above is made of ITO because the ITO film has a high electrical-conductivity, a high transmittivity of visible light, a high mechanical rigidity, and good chemical stability, and it can be electrically connected with the cathode layer 3 while guaranteeing the transmittivity of light.

Optionally, the cathode layer 3 is made of a magnesium-silver alloy.

Some embodiments of the disclosure further provide a method for fabricating the display panel above, where the method includes the steps of:

forming a pixel definition layer 2 on a base substrate 1, and patterning the pixel definition layer 2 in an etching process;

forming a cathode layer 3 and a transparent electrically-conductive film 4 successively on the pixel definition layer 2, the transparent electrically-conductive film 4 is electrically connected with the cathode layer 3.

In the method above for fabricating the display panel, the transparent electrically-conductive film 4 electrically connected with the cathode layer 3 is arranged on the side of the cathode layer 3 away from the base substrate 1 to thereby expand a channel of current so as to lower a cathode resistance, thus reducing a voltage drop on the side of the display panel away from an integrated circuit, and improving the uniformity of brightness of the display panel.

Optionally, before the transparent electrically-conductive film 4 is formed on the cathode layer 3, the method further includes:

forming a polarizing sheet 5 on the cathode layer 3, and forming a plurality of through-holes 7 on the polarizing sheet 5 in a patterning process, where a projection of each through-hole 7 onto the base substrate 1 does not overlap with a projection of pixel in the pixel definition layer onto the base substrate 1.

The plurality of through-holes 7 are formed on the polarizing sheet 5, and the transparent electrically-conductive film 4 is electrically connected with the cathode layer 3 through the through-holes to thereby lower the resistance of the cathode layer 3, thus reducing a voltage drop on the side of the display panel away from an integrated circuit, and improving the uniformity of brightness of the display panel.

Moreover, in some embodiments, the projections of the through-holes onto the base substrate 1 lie in a projection of the pixel definition layer onto the base substrate 1 to thereby enable light to exit the pixel definition layer 2 normally.

Optionally, the method further includes the step of:

forming a protecting layer 6 on the transparent electrically-conductive film 4.

The protecting layer is arranged to protect the transparent electrically-conductive film from being scratched so as to prolong the lifetime of the display panel.

Optionally, the method further includes the steps of:

forming a polarizing sheet 5 on the transparent electrically-conductive film; and forming a protecting layer on the polarizing sheet 5.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising:
   a base substrate, a pixel definition layer, a cathode layer and a polarizing sheet with a plurality of through-holes arranged on one side of the base substrate successively, and
   a transparent electrically-conductive film arranged on a side, away from the base substrate, of the polarizing sheet,
   wherein, the transparent electrically-conductive film is electrically connected directly with the cathode layer through the plurality of through-holes, so that the transparent electrically-conductive film is in parallel with the cathode layer; and
   wherein projection of each through-hole onto the base substrate does not overlap with a projection of a pixel on the pixel definition layer onto the base substrate.

2. The display panel according to claim 1, wherein a protecting layer is arranged on a side of the transparent electrically-conductive film away from the base substrate.

3. The display panel according to claim 1, wherein a polarizing sheet and a protecting layer are arranged on a side of the transparent electrically-conductive film away from the base substrate successively.

4. The display panel according to claim 1, wherein the transparent electrically-conductive film is an ITO film.

5. The display panel according to claim 1, wherein the cathode layer is made of a magnesium-silver alloy.

6. A method for fabricating the display panel according to claim 1, the method comprising:

forming a pixel definition layer on a base substrate, and patterning the pixel definition layer in an etching process;

forming a cathode layer, a polarizing sheet with a plurality of through-holes and a transparent electrically-conductive film successively on the pixel definition layer;

wherein the transparent electrically-conductive film is electrically connected directly with the cathode layer through the plurality of through-holes;

wherein the method further comprises:

forming the plurality of through-holes in a patterning process, wherein a projection of each through-hole onto the base substrate does not overlap with a projection of a pixel on the pixel definition layer onto the base substrate.

7. The method according to claim 6, further comprises:

forming a protecting layer on the transparent electrically-conductive film.

8. The method according to claim 6, further comprises:

forming a polarizing sheet on the transparent electrically-conductive film; and forming a protecting layer on the polarizing sheet.

\* \* \* \* \*